United States Patent [19]
Morikawa et al.

[11] Patent Number: 5,773,892
[45] Date of Patent: Jun. 30, 1998

[54] MULTI-PORT SEMICONDUCTOR MEMORY DEVICE WITH REDUCED COUPLING NOISE

[75] Inventors: Kouichi Morikawa; Jiro Ida, both of Tokyo, Japan

[73] Assignee: Oki Electric Industry Co., Ltd., Tokyo, Japan

[21] Appl. No.: 650,367

[22] Filed: May 20, 1996

[30] Foreign Application Priority Data

Jun. 20, 1995 [JP] Japan ................................. 7-152954

[51] Int. Cl.⁶ ................................................. H01L 29/41
[52] U.S. Cl. ...................... 257/758; 257/775; 257/907; 365/214; 365/230.05
[58] Field of Search .................................. 257/907, 775, 257/758; 365/214, 230.05

[56] References Cited

U.S. PATENT DOCUMENTS

| | | | |
|---|---|---|---|
| 4,626,889 | 12/1986 | Yamamoto | 257/773 |
| 5,170,243 | 12/1992 | Dhong | 257/907 |
| 5,471,093 | 11/1995 | Cheung | 257/758 |
| 5,585,664 | 12/1996 | Ito | 257/758 |
| 5,594,279 | 1/1997 | Itou | 257/758 |
| 5,602,772 | 2/1997 | Nakano | 365/214 |

FOREIGN PATENT DOCUMENTS

| | | | |
|---|---|---|---|
| 2-183490 | 7/1990 | Japan . | |
| 2178951 | 7/1990 | Japan | 257/775 |
| 2237138 | 9/1990 | Japan | 257/775 |
| 3-72674 | 3/1991 | Japan . | |
| 5-109287 | 4/1993 | Japan . | |
| 5-325542 | 12/1993 | Japan . | |
| 6105501 | 4/1994 | Japan | 257/907 |

OTHER PUBLICATIONS

Sugano, CMOS VLSI Design, Baifukan, Apr. 25, 1989, p. 231.

*Primary Examiner*—Jerome Jackson

[57] ABSTRACT

A semiconductor memory device has two complementary pairs of bit lines coupled to the same memory cells. According to a first aspect of the invention, the bit lines in one complementary pair cross over, so that each bit line in the first pair runs adjacent to one bit line in the second pair for one part of its length, and adjacent to the other bit line in the second pair for another part of its length. Coupling noise is thereby neutralized. Data-inverting circuitry is provided to compensate for the inversion of data that results from the cross-over of the bit lines. According to a second aspect of the invention, the two complementary pairs of bit lines are placed in separate interconnecting layers, to reduce coupling noise by reducing the capacitive coupling between the bit lines.

17 Claims, 14 Drawing Sheets

MULTI-PORT SEMICONDUCTOR MEMORY DEVICE WITH REDUCED COUPLING NOISE

BACKGROUND OF THE INVENTION

The present invention relates to a multi-port semiconductor memory device in which each memory cell is coupled to at least two complementary pairs of bit lines.

An example of this type of memory device is a multi-port static random-access memory (SRAM) in which each memory cell is coupled by transistors to a complementary pair of read bit lines, which supply data to an output port, and a complementary pair of write bit lines, which receive data from an input port. When data are written in a memory cell, the transistors coupling the memory cell to the write bit lines are switched on, and a write driver drives one of the write bit lines to the high level and the other write bit line to the low level. When data are read from a memory cell, the transistors coupling the corresponding memory cells to the read bit lines are switched on, thereby placing the two read bit lines at different electrical potentials, and the potential difference between the read bit lines is amplified by a sense amplifier.

The read and write bit lines are laid out so that each read bit line runs adjacent and parallel to one of the write bit lines for a considerable distance. Capacitive coupling between the adjacent bit lines creates a problem known as coupling noise. When the write driver alters the potential of a write bit line, the alteration is temporarily coupled onto the adjacent read bit line, possibly reversing the potential relationship between the two read bit lines. To avoid having this reversed potential relationship read out as incorrect data, operation of the sense amplifier must be delayed until sufficient time has elapsed for the correct potential relationship to be restored.

As memory integration densities rise, the spacing between the bit lines decreases and the problem of coupling noise becomes increasingly serious. In a typical multi-port SRAM with 0.35-$\mu$m design rules, for example, the spacing between adjacent read and write bit lines is 0.5 $\mu$m, and the capacitance between the bit lines is 0.1 pF, enough to require a significant delay of sense-amplification in order to ensure that correct data are read. The result is an undesirable data output delay.

The problem of coupling noise also appears in single-port dynamic random-access memory devices, in which the same bit lines are used for both read and write access. A known countermeasure to coupling noise in dynamic random-access memories is to have the two bit lines in each complementary pair cross over at one or more points. These cross-overs invert the data on the bit lines, but since the same bit lines are used for both reading and writing, the read and write data are inverted in the same way and no problem arises.

In a multi-port semiconductor memory, in which the same memory cells are accessed through different pairs of bit lines, the bit-line cross-over method of dealing with coupling noise cannot be employed without separate means of overcoming the problem of data inversion.

SUMMARY OF THE INVENTION

It is accordingly an object of the present invention to reduce the effect of coupling noise between different pairs of bit lines in a multi-port semiconductor memory device.

Another object of the invention is to increase the integration density of a multi-port semiconductor memory device.

The invented semiconductor memory device has a plurality of memory cells. Each memory cell has four switches through which the memory cell is coupled to a first bit line, a second bit line, a third bit line, and a fourth bit line. The first and second bit lines form a first complementary pair of bit lines. The third and fourth bit lines form a second complementary pair of bit lines. The switches are controlled by word lines.

According to a first aspect of the invention, the memory cells are divided into a first group and a second group. At points where the bit lines are coupled to memory cells in the first group, the first and third bit lines are mutually adjacent, and the second and fourth bit lines are mutually adjacent. At points where the bit lines are coupled to memory cells in the second group, the first and fourth bit lines are mutually adjacent, and the second and third bit lines are mutually adjacent. The semiconductor memory device also has an inverting means coupled to the word lines, for detecting word-line states that couple memory cells in the first group to the second complementary pair of bit lines, and inverting data on the second complementary pair of bit lines when these word-line states occur.

In this first aspect of the invention, the first complementary pair of bit lines may be used for reading data and the second complementary pair of bit lines for writing data, or the first complementary pair of bit lines may be used for writing data and the second complementary pair of bit lines for reading data. In either case coupling noise affects both read bit lines in the same way, so the net effect is zero.

According to a second aspect of the invention, the memory cells are formed in a semiconductor substrate. The first complementary pair of bit lines is formed in a first interconnecting layer disposed above the semiconductor substrate. The second complementary pair of bit lines is formed in a second interconnecting layer disposed above the first interconnecting layer. Placing the two complementary pairs of bit lines in different interconnecting layers reduces coupling noise by reducing the capacitive coupling between the bit lines. Integration density can also be raised by placing the second complementary pair of bit lines directly above the first complementary pair of bit lines.

DETAILED DESCRIPTION OF THE INVENTION

Embodiments of the invention will be described below with reference to the attached illustrative drawings.

First Embodiment

Figure 1:
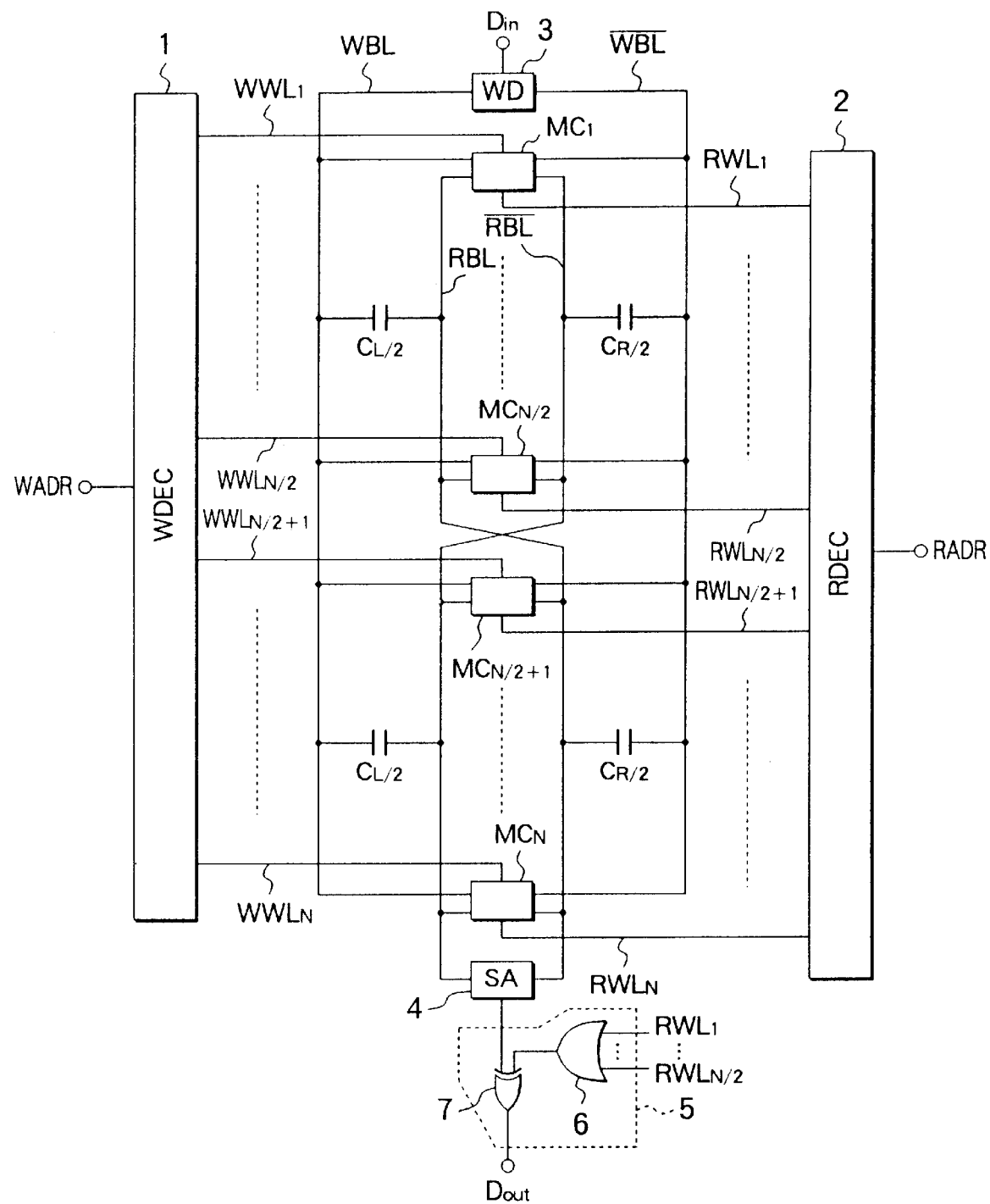
FIG. 1 is a circuit diagram of a first embodiment of the invention.

FIG. 1 shows an array of memory cells in a multi-port SRAM illustrating a first embodiment of the invention. There are N memory cells in the array, where N is an arbitrary positive even integer. The memory cells are numbered from $MC_1$ to $MC_N$. The memory cells are divided into two groups, the first group comprising memory cells $MC_1$ to $MC_{N/2}$, and the second group comprising the remaining memory cells $MC_{N/2+1}$ to $MC_N$.

Write access to the memory cells is controlled by a write decoder (WDEC) 1, which receives a write address signal WADR and selects a corresponding one of the memory cells $MC_1$ to $MC_N$. The selection is made via write word lines $WWL_1$ to $WWL_N$ that couple the write decoder 1 to the memory cells. Memory cell $MC_i$ is selected for write access when the corresponding write word line $WWL_i$ is driven to the active (high) state.

Read access is similarly controlled by a read decoder (RDEC) 2 that receives a read address signal RADR and selects the memory cells via read word lines $RWL_1$ to $RWL_N$. The read word lines can be divided into a first group, comprising $RWL_1$ to $RWL_{N/2}$, that selects memory cells $MC_1$ to $MC_{N/2}$, and a second group, comprising $RWL_{N/2+1}$ to $RWL_N$, that selects memory cells $MC_{N/2+1}$ to $MC_N$.

Write data Din are input to a write driver (WD) 3 that drives a complementary pair of write bit lines WBL and $\overline{WBL}$. The write driver 3 drives the first write bit line WBL to the same state (high or low) as the input data Din, and the second write bit line $\overline{WBL}$ to the opposite state. Each memory cell is coupled to both write bit lines WBL and $\overline{WBL}$.

The memory cells are also coupled to a complementary pair of read bit lines RBL and $\overline{RBL}$, which are coupled to a sense amplifier (SA) 4 that amplifies potential differences on the read bit lines. The output of the sense amplifier 4 goes high when the $\overline{RBL}$ potential is higher than the RBL potential, and goes low when the $\overline{RBL}$ potential is lower than the RBL potential.

In this first embodiment, the read bit lines RBL and $\overline{RBL}$ cross over between memory cells $MC_{N/2}$ and $MC_{N/2+1}$. The first read bit line RBL is adjacent to the first write bit line WBL in the area where the bit lines are coupled to the first group of memory cells, and adjacent to the second write bit line $\overline{WBL}$ in the area where the bit lines are coupled to the second group of memory cells. Similarly, the second read bit line $\overline{RBL}$ is adjacent to the second write bit line $\overline{WBL}$ in the area where the bit lines are coupled to the first group of memory cells, and adjacent to the first write bit line WBL in the area where the bit lines are coupled to the second group of memory cells. Because of the crossover, data reaching the sense amplifier 4 from the first group of memory cells ($MC_1$ to $MC_{N/2}$) are inverted.

A novel feature of this embodiment is that the output of the sense amplifier 4 is provided to an inverting means 5 comprising an OR gate 6 and an exclusive-OR gate 7. The OR gate 6 receives as inputs the signals on the first group of read word lines $RWL_1$ to $RWL_{N/2}$, and outputs a logic signal obtained by performing a logical OR operation on these inputs. The exclusive-OR gate 7 receives as inputs the output of the sense amplifier 4 and the logic signal output by the OR gate 6, and performs an exclusive logical OR operation on these inputs, thereby inverting the output of the sense amplifier 4 when the logic signal output by the OR gate 6 is high. The output of the exclusive-OR gate 7 is a bit of output data Dout.

The symbols $C_{L/2}$ and $C_{R/2}$ denote parasitic capacitances between adjacent bit lines. $C_{L/2}$ is equal to substantially half the total parasitic capacitance between bit lines disposed on the left of the memory cells; $C_{R/2}$ is equal to substantially half the total parasitic capacitance between bit lines disposed on the right of the memory cells. The circuit layout is symmetric, so $C_{L/2}$ and $C_{R/2}$ are substantially equal. The capacitors drawn above the symbols $C_{L/2}$ and $C_{R/2}$ are not provided as separate circuit elements; they represent the parasitic capacitance that occurs naturally between adjacent, parallel signal lines.

Figure 2:
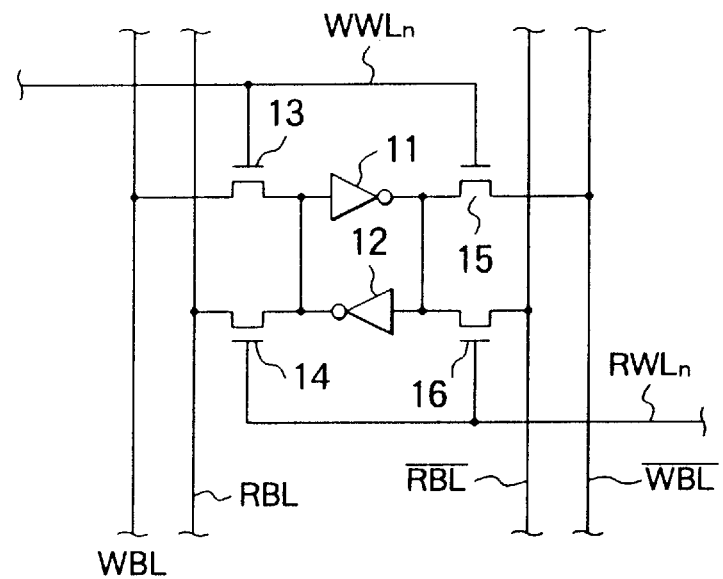
FIG. 2 is a circuit diagram of a memory cell.
Figure 3:
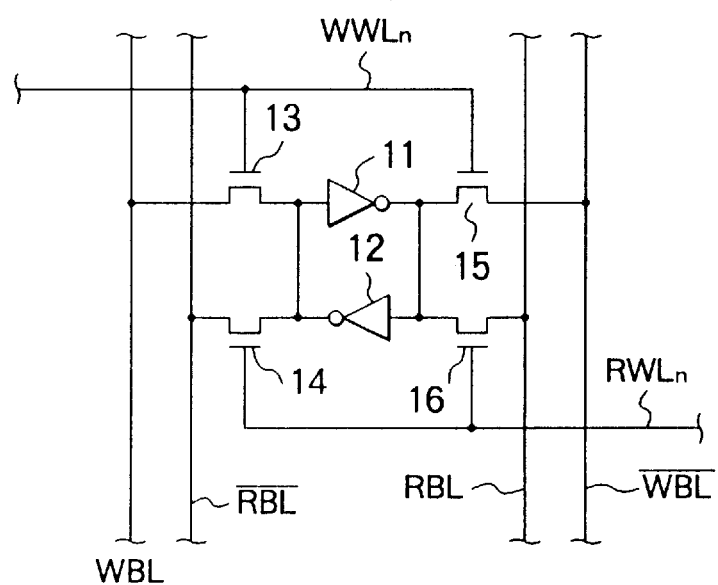
FIG. 3 is another circuit diagram of a memory cell.

FIGS. 2 and 3 show the structure and interconnections of the memory cells in more detail. FIG. 2 applies to the first group of memory cells ($MC_1$ to $MC_{N/2}$). FIG. 3 applies to the second group of memory cells ($MC_{N/2+1}$ to $MC_N$).

Referring to FIG. 2, a memory cell in the first group ($MC_1$ to $MC_{N/2}$) comprises a pair of cross-coupled inverters 11 and 12. The output of inverter 11 is coupled to the input of inverter 12, and the output of inverter 12 to the input of inverter 11. The output of inverter 12 is also coupled through an n-channel metal-oxide-semiconductor (NMOS) transistor 13 to the first write bit line $\overline{WBL}$, and through another NMOS transistor 14 to the first read bit line $\overline{RBL}$. The output of inverter 11 is coupled through an NMOS transistor 15 to the second write bit line $\overline{WBL}$, and through an NMOS transistor 16 to the second read bit line $\overline{RBL}$. The gates of transistors 13 and 15 are coupled to a write word line $WWL_n$, where $1 \leq n \leq N/2$. The gates of transistors 14 and 16 are coupled to the corresponding read word line $RWL_n$.

Referring to FIG. 3, the memory cells in the second group ($MC_{N/2+1}$ to $MC_N$) have the same structure and interconnections, except that the output of inverter 11 is coupled through NMOS transistor 16 to the first read line RBL, and the output of the inverter 12 through NMOS transistor 14 to the second read line $\overline{RBL}$.

Next the operations of writing data, and then reading the same data, will be described for four cases.

The first case is the writing and subsequent reading of low input data Din in a memory cell in the first group.

In the write access, the write decoder 1 activates a write word line $WWL_n$ ($1 \leq n \leq N/2$), switching on transistors 13 and 15 in FIG. 2, and the write driver 3 drives the first write bit line WBL low and the second write bit line $\overline{WBL}$ high. This forces the selected memory cell $MC_n$ into the state in which the output of inverter 11 is high and the output of inverter 12 is low. Memory cell $MC_n$ remains in this state after write word line $WWL_n$ is de-activated.

In the subsequent read access, the read decoder 2 activates read word line $RWL_n$, switching on transistors 14 and 16 in FIG. 2, coupling the high output of inverter 11 onto the second read bit line $\overline{\text{RBL}}$ and the low output of inverter 12 onto the first read bit line RBL. This makes the $\overline{\text{RBL}}$ potential higher than the RBL potential, so the output of the sense amplifier 4 goes high. Since the $\text{RWL}_n$ input to the OR gate 6 is high, the output of the OR gate 6 is high. As both inputs to the exclusive-OR gate 7 are high, the output of the exclusive-OR gate 7 is low, producing low output data Dout matching the original low input data Din.

The second case is the writing of high input data Din in a memory cell in the first group, and the subsequent reading of the data. The write access is carried out as described above, except that the write driver 3 drives the first write bit line WBL high and the second write bit line $\overline{\text{WBL}}$ low, forcing memory cell $\text{MC}_n$ ($1 \leq n \leq N/2$) into the state in which the output of inverter 11 is low and the output of inverter 12 is high. In the subsequent read access, the $\overline{\text{RBL}}$ potential therefore becomes lower than the RBL potential, and the output of the sense amplifier 4 goes low. The $\text{RWL}_n$ input to the OR gate 6 is again high, so the output of the OR gate 6 is high. The exclusive-OR gate 7 now receives one low input one and high input, and therefore produces high output data Dout, matching the original high input data Din.

The third case is the writing and subsequent reading of low input data Din in a memory cell in the second group of memory cells $\text{MC}_n$ ($N/2+1 \leq n \leq N$), illustrated in FIG. 3. The write access is carried out as in the first case, placing memory cell $\text{MC}_n$ in the state in which the output of inverter 11 is high and the output of inverter 12 is low. In the read access, the high output of inverter 11 is coupled by transistor 16 in FIG. 3 onto the first read bit line RBL, and the low output of inverter 12 by transistor 14 onto the second read bit line $\overline{\text{RBL}}$, making the $\overline{\text{RBL}}$ potential lower than the RBL potential. The output of the sense amplifier 4 therefore goes high. The OR gate 6 does not receive $\text{RWL}_n$ as an input signal (because n>N/2), so all inputs to the OR gate 6 are low, hence the output of the OR gate 6 is low. As both inputs to the exclusive-OR gate 7 are low, the exclusive-OR gate 7 produces low output data Dout, again matching the original low input data Din.

The fourth case is the writing of high input data Din in a memory cell in the second group of memory cells $\text{MC}_n$ ($N/2+1 \leq n \leq N$), and the subsequent reading of the data. The write access is carried out as in the second case, placing memory cell $\text{MC}_n$ in the state in which the output of inverter 11 is low and the output of inverter 12 is high. In the read access, the outputs of inverters 11 and 12 make the $\overline{\text{RBL}}$ potential higher than the RBL potential, so the output of the sense amplifier 4 goes high. As the output of the OR gate 6 is low, the exclusive-OR gate 7 produces high output data Dout, once again matching the original high input data Din.

In short, data read from memory cells in the first group ($\text{MC}_1$ to $\text{MC}_{N/2}$) are inverted by the cross-over of the read bit lines, but the output of the sense amplifier 4 is inverted by the inverting means 5, so correct read data are obtained. Data read from the memory cells in the second group ($\text{MC}_{N/2+1}$ to $\text{MC}_N$) are not inverted by the cross-over of the read bit lines, and are not inverted by the inverting means 5, so correct read data are likewise obtained.

Figure 4:
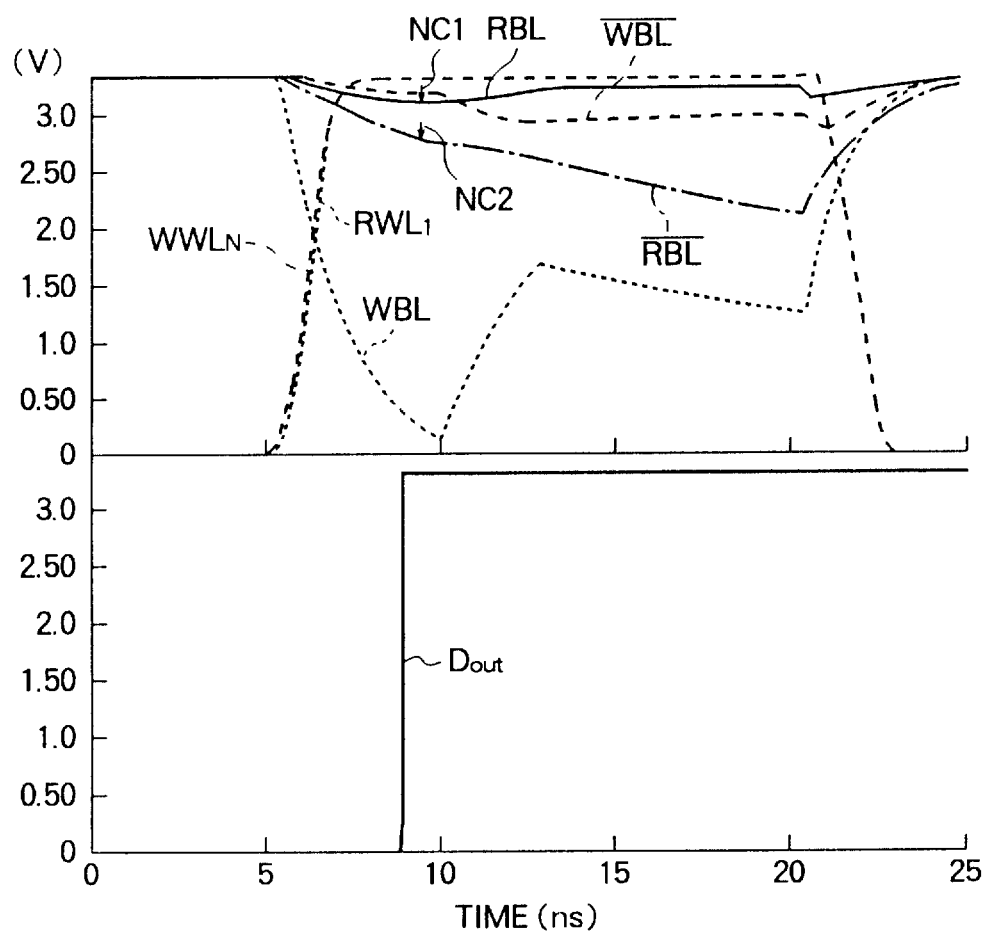
FIG. 4 is a timing diagram illustrating the operation of the first embodiment.

Next the operation of simultaneous read and write access to different memory cells will be described, taking as an example the writing of low input data into memory cell $\text{MC}_N$ in the second group and the simultaneous reading of high output data from memory cell $\text{MC}_1$ in the first group. The timing of this operation is illustrated in FIG. 4. The horizontal axis indicates time in nanoseconds; the vertical axis indicates potential in volts. At the beginning of the operation, all bit lines are at the high level, e.g. 3.3 V, and all word lines are in the inactive (low) state, e.g. at 0 V. It will be assumed that the data stored in memory cell $\text{MC}_1$ are such that the output of inverter 11 onto the second read bit line $\overline{\text{RBL}}$ is low and the output of inverter 12 onto the first read bit line RBL is high.

In response to input of read and write addresses RADR and WADR, the write decoder 1 drives write word line $\text{WWL}_N$ to the active (high) state, and the read decoder 2 simultaneously drives read word line $\text{RWL}_1$ to the active (high) state, as shown at the top in FIG. 4. The transistors 13 and 15 driven by write word line $\text{WWL}_N$ and the transistors 14 and 16 driven by read word line $\text{RWL}_1$ switch on, coupling memory cell $\text{MC}_N$ to the write bit lines WBL and $\overline{\text{WBL}}$, and memory cell $\text{MC}_1$ to the read bit lines RBL and $\overline{\text{RBL}}$.

The write driver 3 then drives the first write bit line WBL low, leaving $\overline{\text{WBL}}$ in the high state, thus writing the low input data Din in memory cell $\text{MC}_N$. At the same time, the second read bit line $\overline{\text{RBL}}$ begins to discharge through the transistors in memory cell $\text{MC}_1$, and the $\overline{\text{RBL}}$ potential begins to fall. In addition, because of the capacitive coupling of write bit line WBL to read bit line RBL in the area of memory cells $\text{MC}_1$ to $\text{MC}_{N/2}$, and to read bit line $\overline{\text{RBL}}$ in the area of memory cells $\text{MC}_{N/2+1}$ to $\text{MC}_N$, the fall of the WBL potential causes a temporary dip in the potentials on both read bit lines RBL and $\overline{\text{RBL}}$. These temporary potential dips constitute coupling noise, and are indicated by downward-pointing arrows $\text{NC}_1$ and $\text{NC}_2$ in FIG. 4.

Since the capacitive coupling of both read bit lines to WBL is substantially the same (in FIG. 1, $C_{L/2}=C_{R/2}$), both read bit lines are equally affected by coupling noise. The coupling noise thus cancels out, leaving the potential difference between read bit lines RBL and $\overline{\text{RBL}}$ substantially unchanged. The potential relationship of the two read bit lines does not reverse; the $\overline{\text{RBL}}$ potential is consistently lower than the RBL potential.

At a time equal to substantially 8.7 ns on the horizontal axis in FIG. 4, the potential difference between the read bit lines RBL and $\overline{\text{RBL}}$ has become sufficient for the sense amplifier 4 to operate, and the sense amplifier output goes low. Since the $\text{RWL}_1$ input to the OR gate 6 is high, the output of the OR gate 6 is high. Receiving one high input and one low input, the exclusive-OR gate 7 produces high output data Dout as shown at the bottom of FIG. 4.

Figure 5:
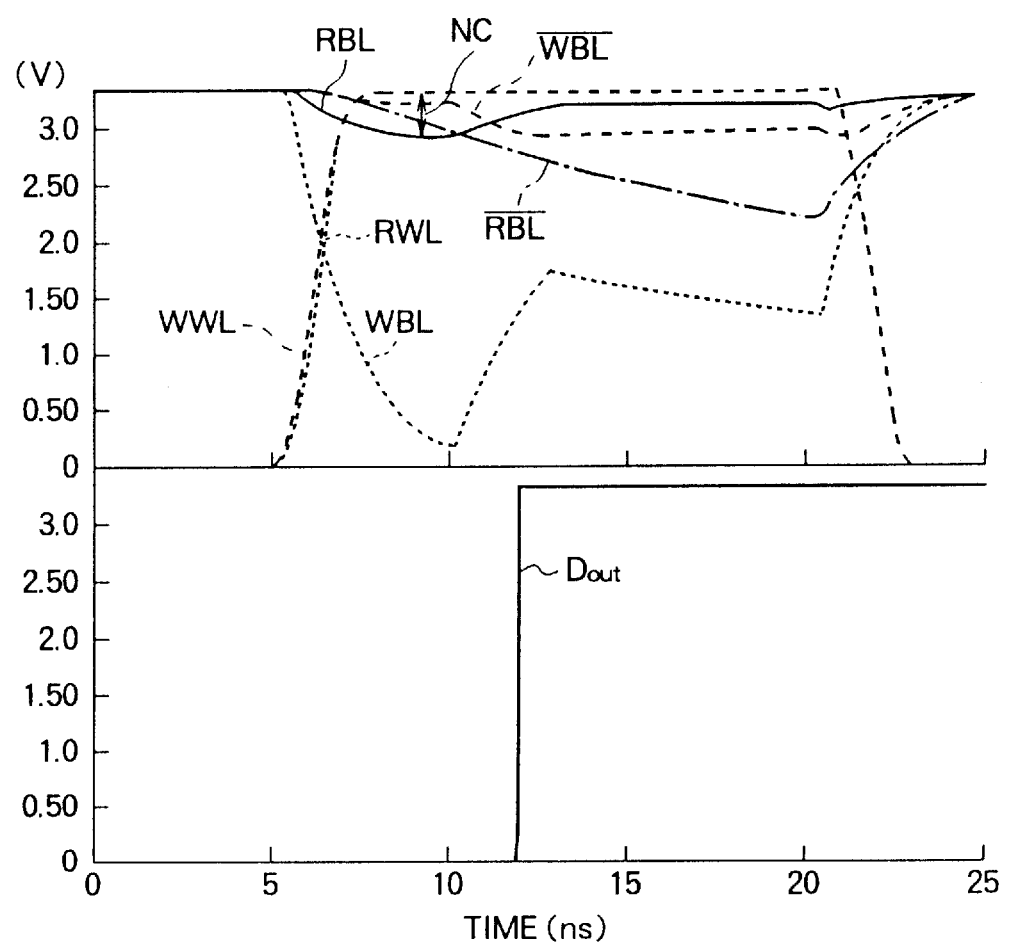
FIG. 5 is a timing diagram illustrating the operation of a prior-art memory.

For comparison, FIG. 5 shows the same operation in a prior-art memory device in which the read bit lines do not cross over, so that the first read bit line RBL is adjacent to the first write bit line WBL throughout its length. In this case, coupling noise due to the fall of write bit line WBL lowers the potential on the first read bit line RBL by an amount NC, without affecting the potential on the second read bit line $\overline{\text{RBL}}$. As a result, the potential of read bit line RBL temporarily dips below than the potential of bit line $\overline{\text{RBL}}$. Sensing cannot be allowed to start until this state has been corrected; consequently, the output data Dout are not obtained until a time equal to substantially 11.8 ns on the horizontal axis.

The effect of the first embodiment in neutralizing coupling noise and enabling sense amplification to begin quickly does not depend on the separation between adjacent bit lines. Coupling noise is neutralized no matter how small the separation and how large the capacitance between the adjacent bit lines become. The invention accordingly permits high-speed multi-port SRAMs to be fabricated with very small feature sizes and high integration densities.

Second Embodiment

Figure 6:
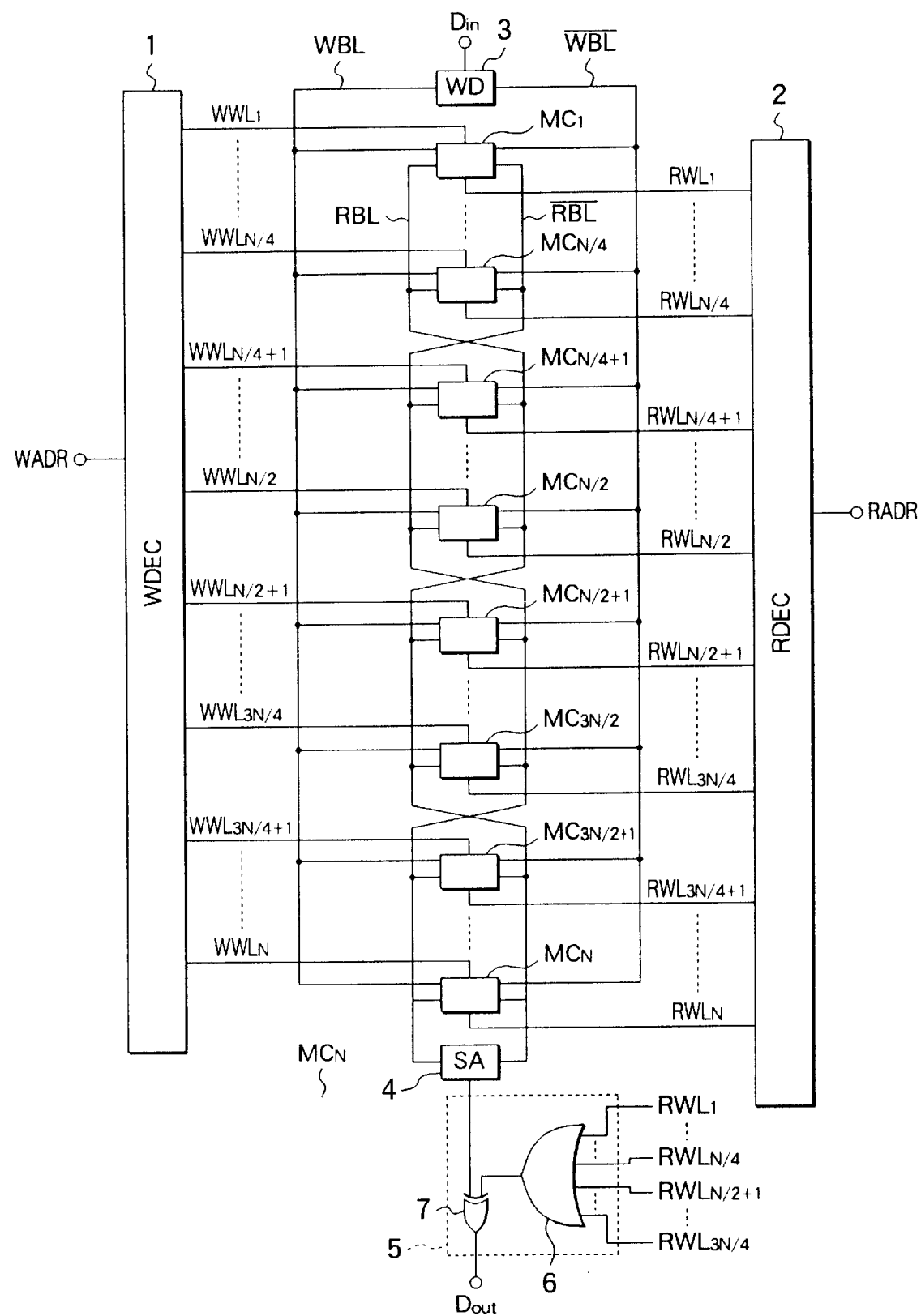
FIG. 6 is a circuit diagram of a second embodiment of the invention.

FIG. 6 illustrates a second embodiment of the invention, using the same reference numerals and symbols as in FIG. 1 for equivalent or identical elements.

The difference between the first and second embodiments is that in the second embodiment, the read bit lines RBL and $\overline{\text{RBL}}$ cross over three times instead of just once. The inputs to the OR gate 6 are read word line signals $RWL_1$ to $RWL_{N/4}$ and $RWL_{N/2+1}$ to $RWL_{3N/4}$. Memory cells $MC_1$ to $MC_{N/4}$ and $MC_{N/2+1}$ to $MC_{3N/4}$ now constitute the first group of memory cells, and memory cells $MC_{N/4+1}$ to $MC_{N/2}$ and $MC_{3N/4+1}$ to $MC_N$ constitute the second group. Because of the repeated crossing-over of the read bit lines, data read from the first group of memory cells reach the sense amplifier 4 in an inverted state, but when these memory cells are selected, the output of the OR gate 6 is high, and the output of the sense amplifier 4 is inverted by the exclusive-OR gate 7. Correct read data are therefore obtained.

Aside from this difference, the second embodiment operates in the same way as the first, so a separate description will be omitted.

If the capacitive coupling between the read and write bit lines varies along the length of the bit lines, the second embodiment is better able than the first embodiment to equalize the coupling noise. If necessary, the number of cross-over points can be further increased to provide still better equalization of coupling noise.

Third Embodiment

Figure 7:
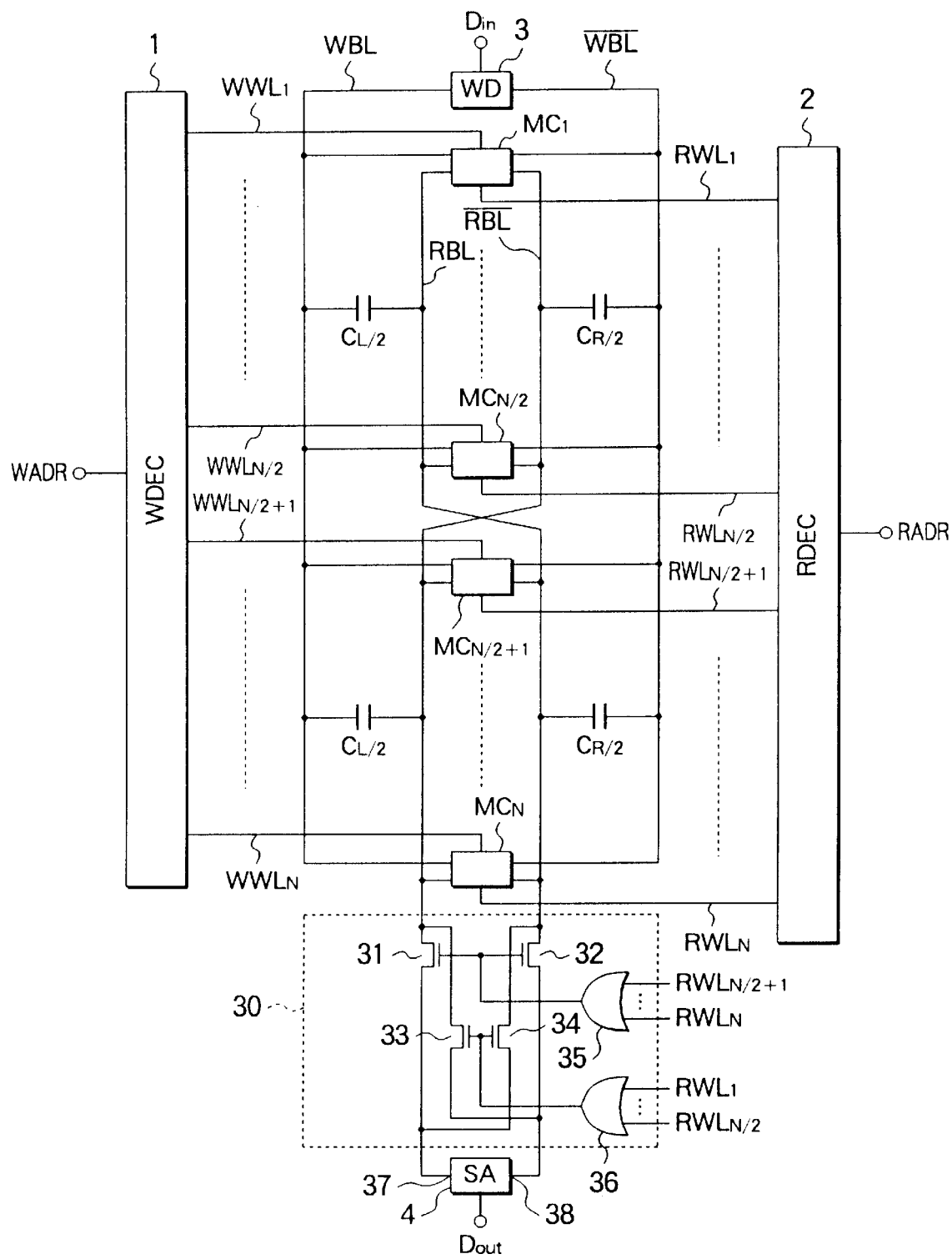
FIG. 7 is a circuit diagram of a third embodiment of the invention.

FIG. 7 illustrates a third embodiment of the invention, again using the same reference numerals and symbols as in FIG. 1 for elements that are identical to the first embodiment. These include the decoders 1 and 2, write driver 3, sense amplifier 4, and memory cells $MC_1$ to $MC_N$. As in the first embodiment, the read bit lines RBL and $\overline{\text{RBL}}$ make one cross-over, between memory cells $MC_{N/2}$ and $MC_{N/2+1}$. The sense amplifier 4 directly provides the output data Dout.

The inverting means 30 of the third embodiment comprises four NMOS transistors 31, 32, 33, and 34, and two OR gates 35 and 36 by which these NMOS transistors are controlled. OR gate 35 receives read word line signals $RWL_{N/2+1}$ to $RWL_N$ as inputs, and provides their logical OR to the gate electrodes of NMOS transistors 31 and 32. OR gate 36 receives read word line signals $RWL_1$ to $RWL_{N/2}$, and provides their logical OR to the gate electrodes of NMOS transistors 33 and 34.

The drain electrodes of NMOS transistors 31 and 33 are both coupled to the second read bit line $\overline{\text{RBL}}$. The drain electrodes of NMOS transistors 32 and 34 are both coupled to the first read bit line RBL. The source electrodes of NMOS transistors 31 and 34 are coupled to one input terminal 37 of the sense amplifier 4. The source electrodes of NMOS transistors 32 and 33 are coupled to the opposite input terminal 38 of the sense amplifier 4.

The operations of reading and writing data in the third embodiment are the same as in the first embodiment, except for the way in which the read data are inverted.

In the third embodiment, when a read word line from $RWL_1$ to $RWL_{N/2}$ is activated, the output of OR gate 36 is high and the output of OR gate 35 is low, so NMOS transistors 33 and 34 are switched on and NMOS transistors 31 and 32 are switched off. The read data, which were inverted by the cross-over of the read bit lines between memory cells $MC_{N/2}$ and $MC_{N/2+1}$, are therefore re-inverted in the inverting means 30 before input to the sense amplifier 4, which accordingly outputs the correct data.

When a read word line from $RWL_{N/2+1}$ to $RWL_N$ is activated, the output of OR gate 35 is high and the output of OR gate 36 is low, so NMOS transistors 31 and 32 are switched on and NMOS transistors 33 and 34 are switched off. The read data, which were not inverted by the cross-over of the read bit lines between memory cells $MC_{N/2}$ and $MC_{N/2+1}$, are not inverted in the inverting means 30 either, so again the sense amplifier 4 outputs the correct data.

The third embodiment provides even faster read access than the first embodiment, because the propagation delay occasioned by NMOS transistors 31, 32, 33, and 34 in the inverting means 30 is less than the propagation delay of the exclusive-OR gate 7 in the first embodiment.

If necessary, the third embodiment can have additional cross-over points as in the second embodiment, provided a corresponding rearrangement of the inputs to the OR gates 35 and 36 is made.

Fourth Embodiment

Figure 8:
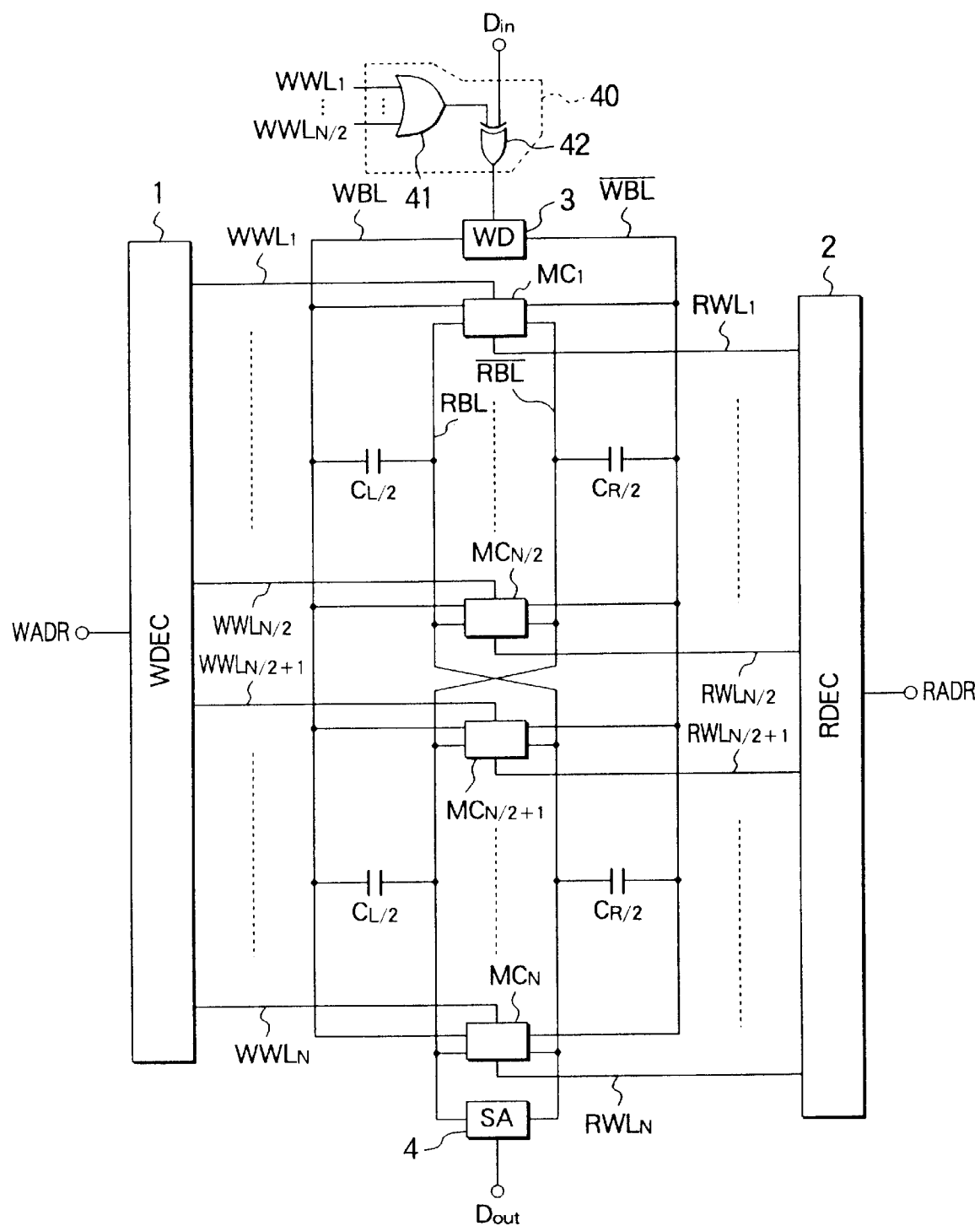
FIG. 8 is a circuit diagram of a fourth embodiment of the invention.

FIG. 8 illustrates a fourth embodiment of the invention, using the same reference numerals and symbols as in FIG. 1 for the decoders 1 and 2, write driver 3, sense amplifier 4, and memory cells $MC_1$ to $MC_N$, which are the same as in the first embodiment. The read bit lines RBL and $\overline{\text{RBL}}$ make one cross-over between memory cells $MC_{N/2}$ and $MC_{N/2+1}$. The output data Dout are obtained directly from the sense amplifier 4.

In the fourth embodiment, write word lines $WWL_1$ to $WWL_{N/2}$ will be referred to as the first group of write word lines, and write word lines $WWL_{N/2+1}$ to $WWL_N$ as the second group.

The inverting means 40 in the fourth embodiment is disposed on the input side of the write driver 3, and is substantially identical to the inverting means in the first embodiment, comprising an OR gate 41 and exclusive-OR gate 42. The OR gate 41 receives write word line signals $WWL_1$ to $WWL_{N/2}$ and outputs a logical OR signal. The exclusive-OR gate 42 receives the logical OR signal output by the OR gate 41 and the input data Din, and outputs their logical exclusive OR to the write driver 3.

Read and write operations are carried out as in the first embodiment, with the exception of the way in which the data are inverted.

In the fourth embodiment, when a write word line in the first group from $WWL_1$ to $WWL_{N/2}$ is activated to write data in one of the memory cells from $MC_1$ to $MC_{N/2}$, the output of the OR gate 41 goes high, causing the exclusive-OR gate 42 to invert the input data Din. The write driver 3 writes the inverted data in the memory cell. When this memory cell is later read, the read data are inverted by the cross-over of the bit read lines between memory cells $MC_{N/2}$ and $MC_{N/2+1}$, so the data output by the sense amplifier 4, having been inverted twice, are the same as the original input data Din.

When a write word line in the second group from $WWL_{N/2+1}$ to $WWL_N$ is activated to write data in a memory cell from $MC_{N/2+1}$ to $MC_N$, the output of the OR gate 41 is low, so the exclusive-OR gate 42 does not invert the input data Din, which are written without inversion in the selected memory cell. Data read from memory cells $MC_{N/2+1}$ to $MC_N$ are not inverted by the cross-over of read bit lines RBL and $\overline{\text{RBL}}$, so again the sense amplifier 4 outputs the same data as the original input data Din.

The fourth embodiment has the same effect as the preceding embodiments in neutralizing coupling noise. The fourth embodiment permits faster read access than any of the preceding embodiments, however, because there is no inverting means on either the input or the output side of the sense amplifier 4.

The fourth embodiment can be modified by providing additional cross-over points on the read bit lines, as in the second embodiment.

The fourth embodiment can also be modified by providing an inverting means similar to the inverting means 30 of the third embodiment on the output side of the write driver 3, instead of the inverting means 40 on the input side of the write driver 3.

Fifth Embodiment

Figure 9:
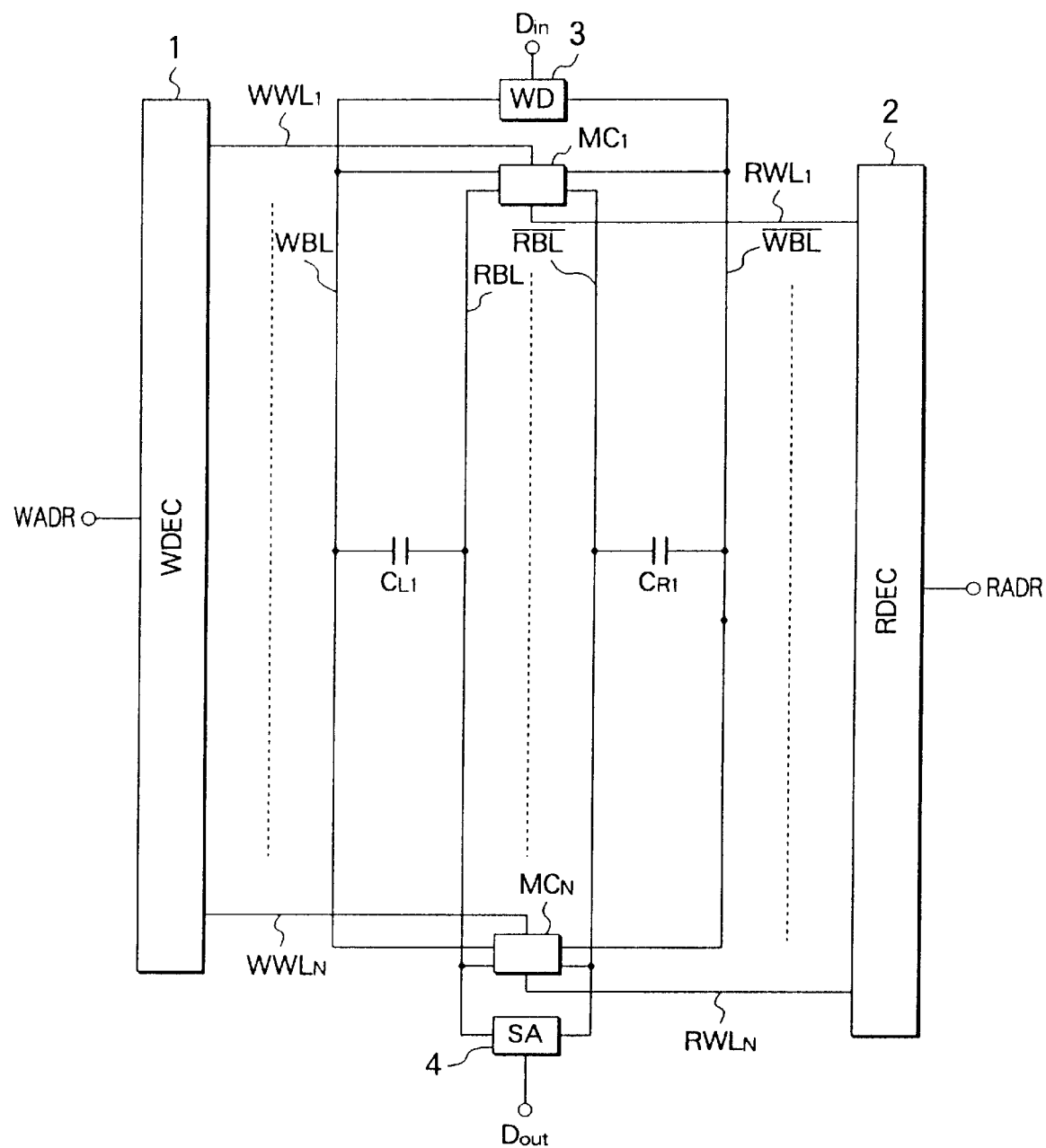
FIG. 9 is a circuit diagram of a fifth embodiment of the invention.

FIG. 9 illustrates a fifth embodiment of the invention. The decoders 1 and 2, write driver 3, sense amplifier 4, and memory cells $MC_1$ to $MC_N$ are the same as in the preceding embodiment, but in the fifth embodiment the bit lines do not cross over, and no inverting means are provided. The symbol $C_{L1}$ represents the parasitic capacitance between the first read and write bit lines RBL and WBL. The symbol $C_{R1}$ represents the parasitic capacitance between the second read and write bit lines $\overline{RBL}$ and $\overline{WBL}$.

Figure 10:
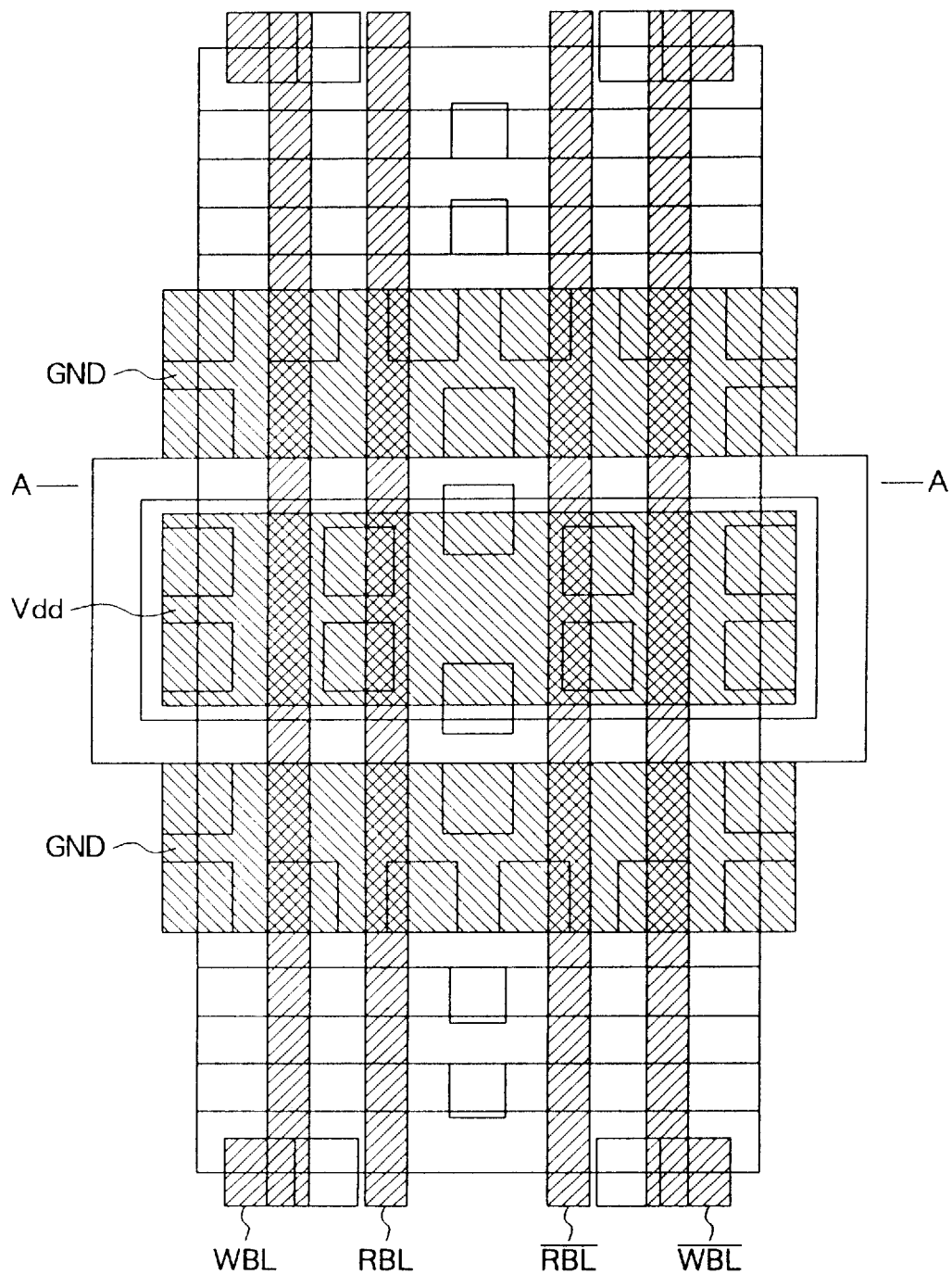
FIG. 10 is a plan view of the layout of the fifth embodiment.
Figure 11:
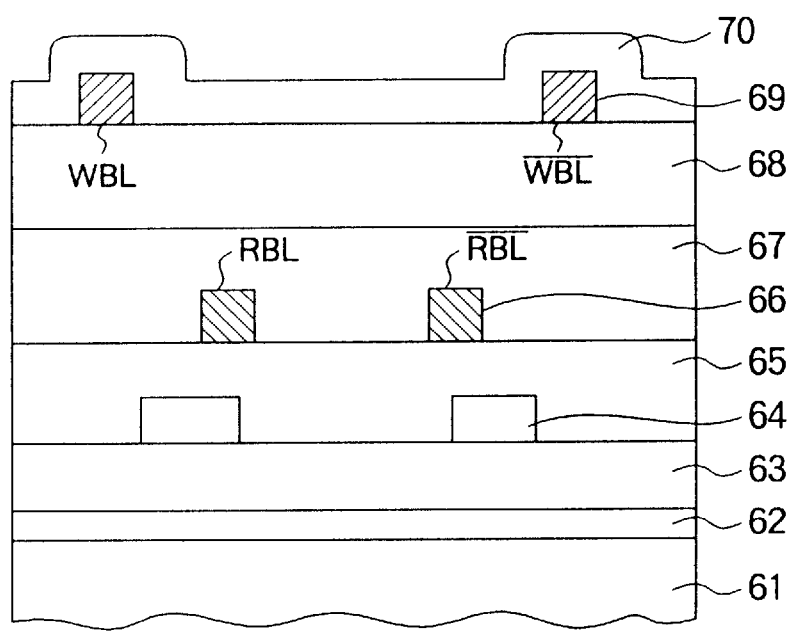
FIG. 11 is a sectional view through line A—A in FIG. 10.

FIG. 10 illustrates the layout of a pair of memory cells in the fifth embodiment, using hatching to indicate the read bit lines RBL and $\overline{RBL}$ and write bit lines WBL and $\overline{WBL}$, and the location of supply-voltage (Vdd) and ground (GND) patterns. FIG. 11 shows a sectional view through line A—A in FIG. 10. A brief description of the structure and fabrication of the fifth embodiment will be given with reference to these drawings.

Referring to FIG. 11, wells (not visible) are formed by selective diffusion in a silicon substrate 61, and the active regions of circuit elements such as n-channel (NMOS) and p-channel (PMOS) transistors (also not visible) are formed by well-known methods. It will be assumed that these elements are formed with 0.35-μm design rules, so that the gate length of the transistors is 0.35 μm.

Next a field oxide layer 62 substantially three thousand angstroms thick is formed by thermal oxidation of the surface of the silicon substrate. Polysilicon gates (not visible) for the transistors are formed on the field oxide layer 62, and the source and drain electrodes of the transistors (not visible) are created by ion implantation. An intermediate insulating film 63 is deposited on the field oxide layer 62 and polysilicon gates by the well-known chemical vapor deposition (CVD) method.

Next there are formed, in succession, a first interconnecting layer of interconnecting lines 64, a first inter-layer insulating film 65, a second interconnecting layer of interconnecting lines 66, a second inter-layer insulating film 67, a third interconnecting layer of interconnecting lines (not visible), a third inter-layer insulating film 68, a fourth interconnecting layer of interconnecting lines 69, and a silicon-nitride passivation layer 70. The first layer of interconnecting lines 64 comprises, for example, the read word lines $RWL_n$ and write word lines $WWL_n$. The second layer of interconnecting lines 66 comprises the read bit lines RBL and $\overline{RBL}$. The fourth layer of interconnecting lines 69 comprises the write bit lines WBL and $\overline{WBL}$.

The inter-layer insulating films 65, 67, and 68 are formed by the CVD method. Each inter-layer insulating film has a thickness of substantially fourteen thousand angstroms over the exposed portions of the next-lower insulating film. The thickness of the interconnecting lines 64, 66, and 69 is substantially seven thousand angstroms. The thickness of the first and second inter-layer insulating films lines 65 and 67 over the first and second layers of interconnecting lines 64 and 66 is substantially seven thousand angstroms.

The separation between the read bit lines RBL and $\overline{RBL}$ and write bit lines WBL and $\overline{WBL}$ therefore exceeds twenty thousand angstroms or 2.0 μm, four times the separation in the prior art. The parasitic capacitances $C_{L1}$ and $C_{R1}$ in FIG. 9 are correspondingly reduced.

Next the operation of the fifth embodiment will be described.

Read and write operations are carried out as described in the first embodiment. Since the bit lines do not cross over, no data are inverted. For all memory cells, the input data Din written in the memory cell agree with the output data Dout read from the memory cell.

Figure 12:
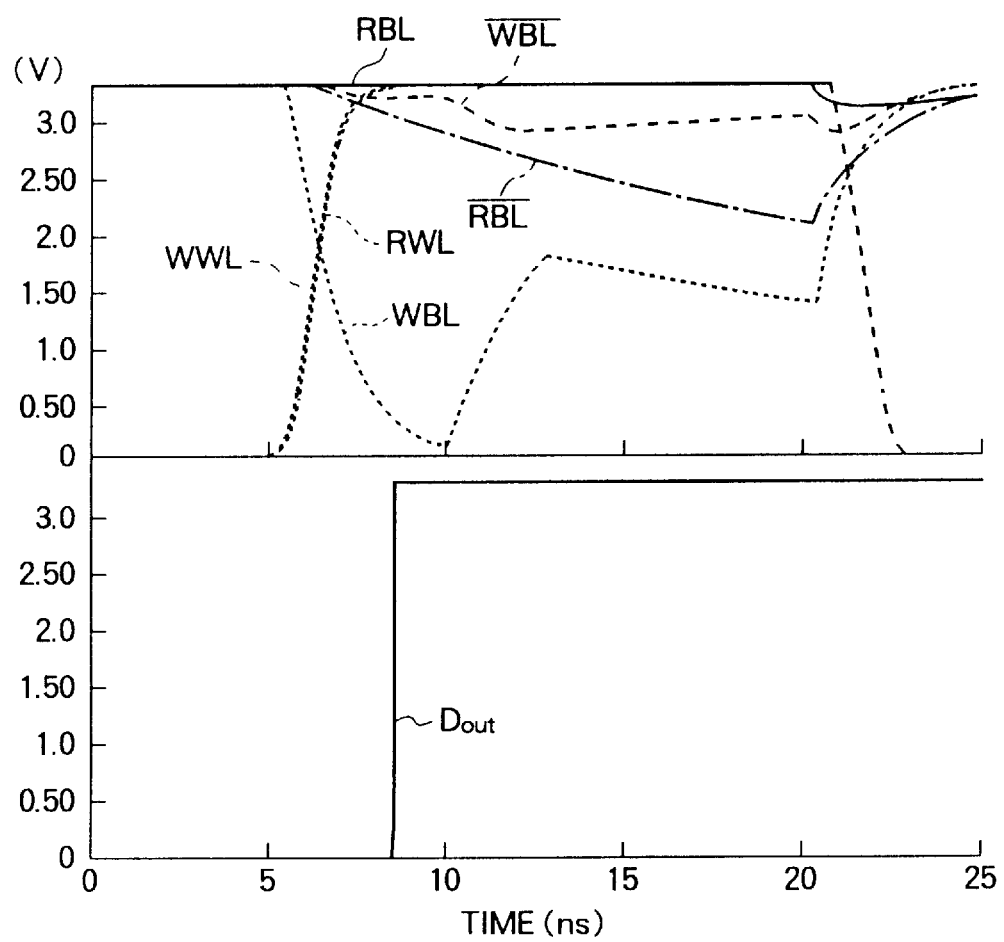
FIG. 12 is a timing diagram illustrating the operation of the fifth embodiment.

The timing of a simultaneous read and write access to different memory cells is illustrated in FIG. 12. The horizontal and vertical axes in FIG. 12 have the same meaning as in FIGS. 4 and 5. A write word line WWL and a read word line RWL are driven active (high) simultaneously. The word driver 3 drives one of the two write bit lines, e.g. the first bit line WBL, to the low level, and the data stored in the corresponding memory cell begin to pull one of the two read bit lines, e.g. the second read bit line $\overline{RBL}$, toward the low level.

Due to the capacitive coupling $C_{L1}$ between the first read bit line RBL and first write bit line WBL, the drop in the WBL potential generates coupling noise on the RBL bit line. The capacitive coupling is weak, however, so the coupling noise is smaller than in the prior art. Indeed, the coupling noise is so small as to be imperceptible in FIG. 12. Since the potential of read bit line RBL does not dip below the potential of read bit line $\overline{RBL}$, sense amplification can begin with little or no delay, and output data Dout can be obtained more quickly than in the prior art, as can be seen by comparing FIGS. 5 and 12.

An advantage of having the complementary pairs of bit lines not cross over in the fifth embodiment is that each pair of bit lines can remain in the same interconnecting layer throughout its length. This permits the read and write bit lines to have highly uniform electrical characteristics, a particularly important factor on the read bit lines.

Sixth Embodiment

The sixth embodiment has the same structure as the fifth embodiment, but the read and write bit lines have trapezoidal cross sections.

Figure 13:
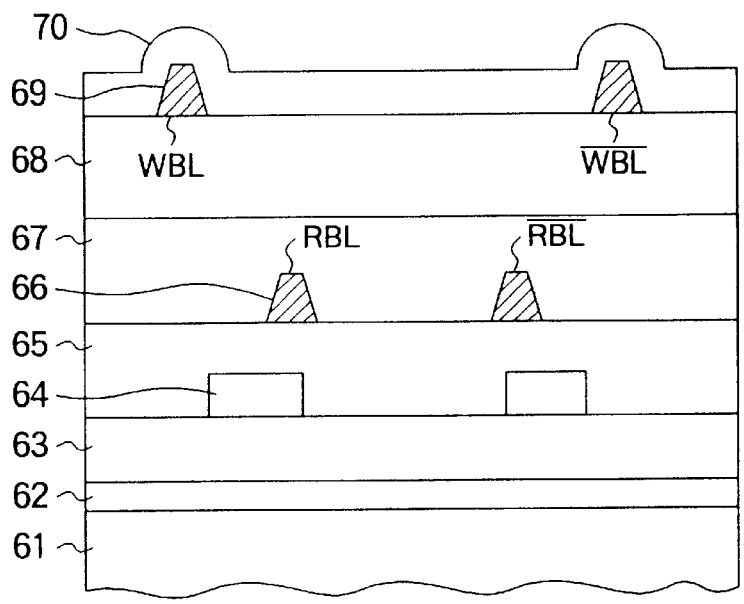
FIG. 13 is a sectional view illustrating a sixth embodiment of the invention.

FIG. 13 is a sectional view of the sixth embodiment, using the same reference numerals as in FIG. 11. The sides of the read bit lines RBL and $\overline{RBL}$ and write bit lines WBL and $\overline{WBL}$ are slanted, making the angles formed by their sides and their bases less than a right angle.

Figure 14:
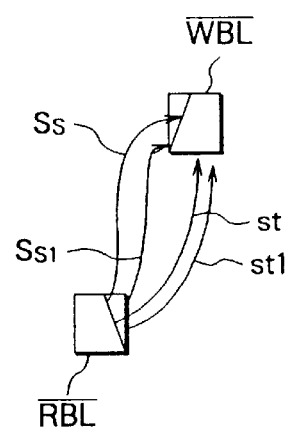
FIG. 14 illustrates the effect of the sixth embodiment.

Referring to FIG. 14, the slanted sides increase the separation between the read and write bit lines. That is, the distance Ss from the slanted side of read bit line $\overline{RBL}$ to the slanted side of write bit line $\overline{WBL}$ is greater than the distance $Ss_1$ that would be observed if the sides were not slanted. Similarly, the distance St from the slanted side of read bit line $\overline{RBL}$ to the base of write bit line $\overline{WBL}$ is greater than the distance $St_1$ that would be observed if the sides were not slanted.

The capacitive coupling $C_{L1}$ and $C_{R1}$ between the read and write bit lines in the sixth embodiment is therefore even less than in the fifth embodiment, and coupling noise is correspondingly reduced.

It is preferable that only the read and write bit lines RBL, $\overline{\text{RBL}}$, WBL, and $\overline{\text{WBL}}$ have slanted sides. Power supply lines, ground lines, and other interconnecting lines, such as long bus lines, on which the voltage drop caused by the resistance of the line is an important consideration, should have conventional vertical sides.

Seventh Embodiment

Figure 15:
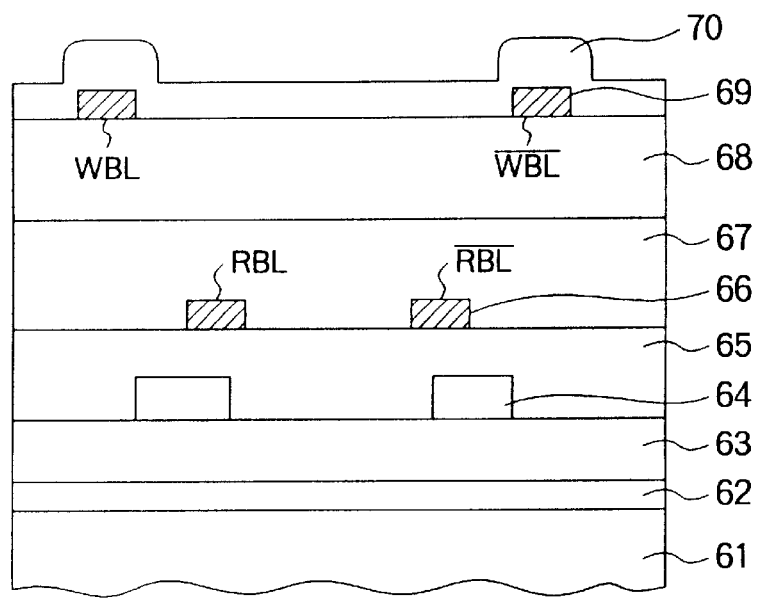
FIG. 15 is a sectional view illustrating a seventh embodiment of the invention.

Referring to FIG. 15, the seventh embodiment reduces the thickness of the read and write bit lines RBL, $\overline{\text{RBL}}$, WBL, and $\overline{\text{WBL}}$, so that the thickness of bit lines RBL, $\overline{\text{RBL}}$, WBL, and $\overline{\text{WBL}}$ is less than the minimum line width. The read and write bit lines accordingly have a vertical thickness less than their horizontal width. Reducing the thickness of the bit lines reduces the capacitive coupling between the bit lines, not only by increasing the vertical distance between the bit lines, but also by decreasing the area of the read bit lines as seen from the write bit lines, and the area of the write bit lines as seen from the read bit lines. Capacitive coupling between the bit lines can be reduced in this way by an amount even greater than the reduction in the sixth embodiment, with a corresponding reduction of coupling noise.

Only the thickness of the read and write bit lines RBL, $\overline{\text{RBL}}$, WBL, and $\overline{\text{WBL}}$ should be reduced. Other interconnecting lines, particularly those on which voltage drop caused by the resistance of the line is an important consideration, should have the normal thickness.

The seventh embodiment operates in the same way as the fifth embodiment, but with even less coupling noise.

Eighth Embodiment

Figure 16:
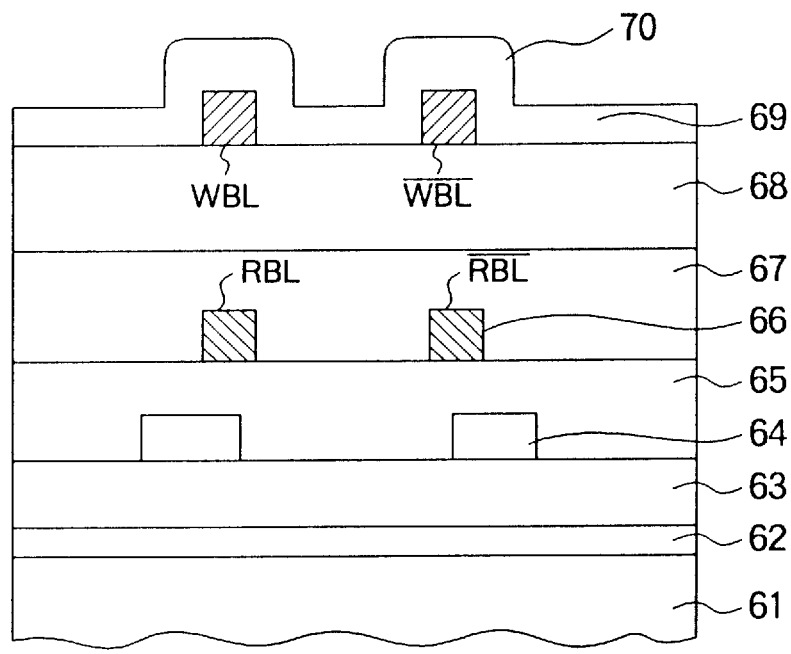
FIG. 16 is a sectional view illustrating an eighth embodiment of the invention.

Referring to FIG. 16, the eighth embodiment is substantially identical to the fifth embodiment, but places the write bit lines WBL and $\overline{\text{WBL}}$ directly over the read bit lines RBL and $\overline{\text{RBL}}$. This arrangement reduces the size of the memory cells, enabling a higher integration density to be achieved. It also reduces capacitive coupling between the bit lines, because the area of the read bit lines as seen from the write bit lines, and of the write bit lines as seen from the read bit lines, is smaller than in the fifth embodiment. Coupling noise is therefore reduced.

The eighth embodiment operates like the fifth embodiment, so further description will be omitted.

Ninth Embodiment

Figure 17:
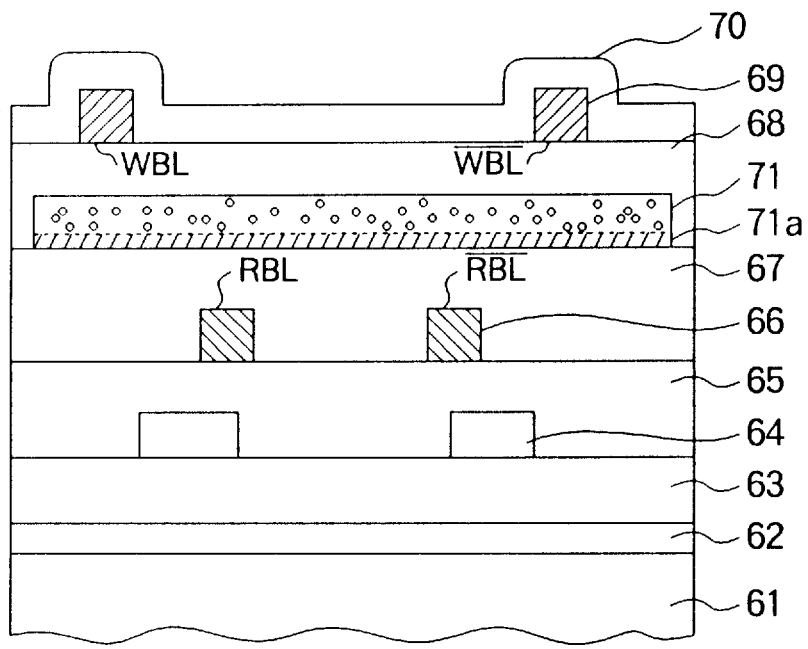
FIG. 17 is a sectional view illustrating a ninth embodiment of the invention.

Referring to FIG. 17, the ninth embodiment introduces a conductive layer 71 into the third interconnecting layer, in the area between the read bit lines RBL and $\overline{\text{RBL}}$ and the write bit lines WBL and $\overline{\text{WBL}}$. This conductive layer 71 reduces the capacitive coupling between the read bit lines RBL and $\overline{\text{RBL}}$ and the write bit lines WBL and $\overline{\text{WBL}}$ by lowering the dielectric constant or permittivity in the space between the bit lines. That is, the lines of force of the electric field flux between the read bit lines RBL and $\overline{\text{RBL}}$ and write bit lines WBL and $\overline{\text{WBL}}$ are interrupted by the conductive layer 71. Coupling noise is therefore reduced as compared with the fifth embodiment.

The conductive layer 71 in FIG. 17 has the same thickness as other interconnecting lines (not visible) in the third interconnecting layer. However, the effectiveness of the conductive layer can be increased by reducing its thickness, e.g. to the thickness of the hatched part 71a in FIG. 17, thereby increasing the distance from the write bit lines WBL and $\overline{\text{WBL}}$.

The ninth embodiment operates like the fifth embodiment, so further description will be omitted.

Tenth Embodiment

The tenth embodiment couples the conductive layer of the ninth embodiment to either the power-supply (Vdd) or ground (GND) pattern.

Figure 18:
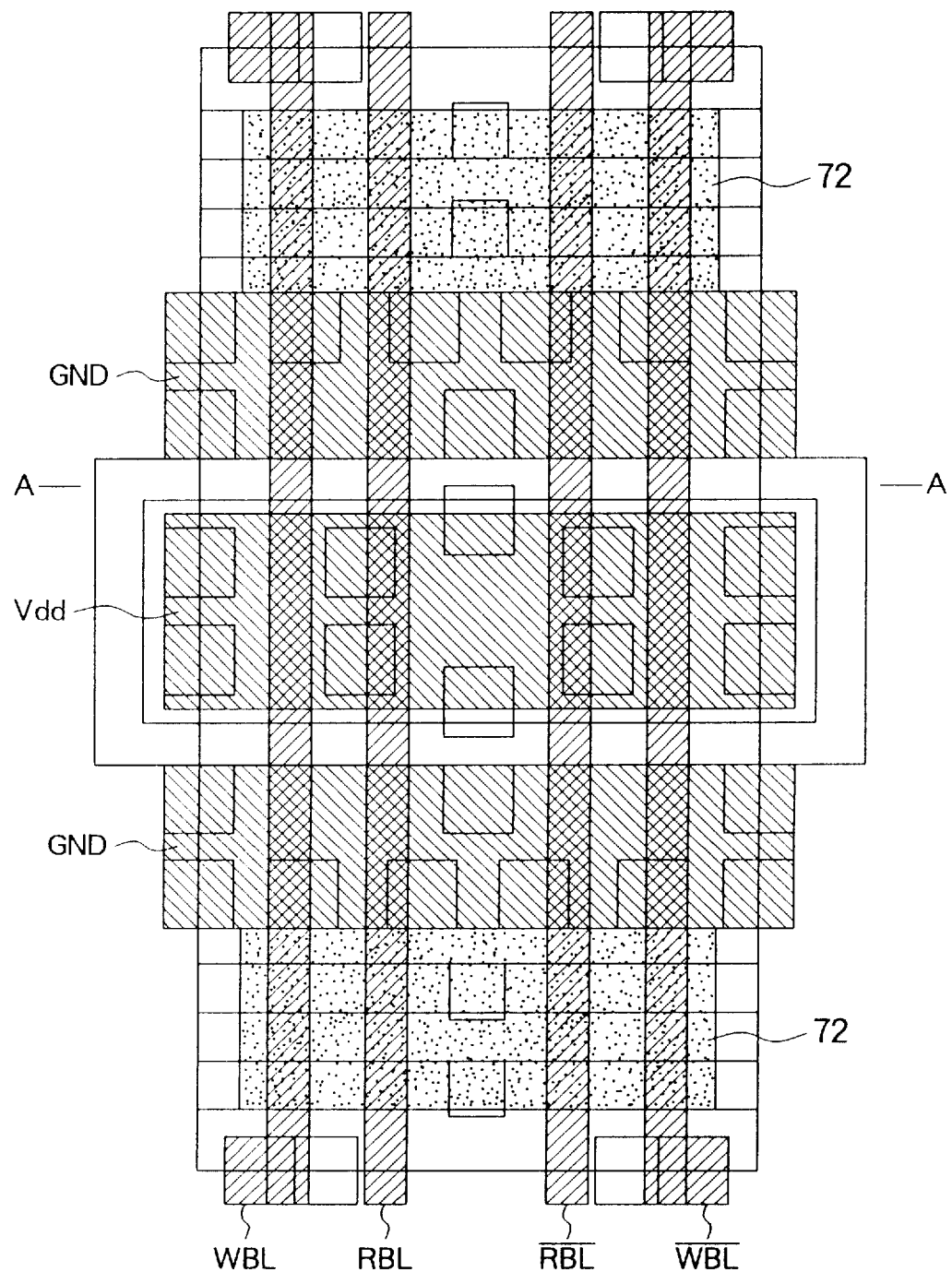
FIG. 18 is a plan view illustrating a tenth embodiment of the invention.

FIG. 18 is a plan view of the layout of the tenth embodiment. The conductive layer comprises a dummy pattern 72. The connection of the dummy pattern 72 to the power-supply pattern or ground pattern is not explicitly indicated in the drawing, because it is possible to make the dummy pattern 72 coincide with the power-supply pattern or ground pattern; that is, to lay the patterns out so that the power-supply pattern (Vdd) or ground pattern (GND) extends throughout the area 72 in FIG. 18.

By placing a conductive layer 72 that is held at a fixed potential (either Vdd or ground) between the read bit lines RBL and $\overline{\text{RBL}}$ and the write bit lines WBL and $\overline{\text{WBL}}$, the tenth embodiment assures more reliable isolation between the read bit lines RBL and $\overline{\text{RBL}}$ and the write bit lines WBL and $\overline{\text{WBL}}$.

The tenth embodiment operates like the fifth embodiment, so further description will be omitted.

The invention is not limited to the foregoing embodiments, but allows further variations. One of these variations is a memory device with two read ports, in which every memory cell is coupled to two complementary pairs of read bit lines, and the object is to reduce coupling noise between these two complementary pairs of read bit lines. In this case, the invention is practiced by substituting one of the pairs of read bit lines for the write bit lines WBL and $\overline{\text{WBL}}$ described in the embodiments.

Any of the first four embodiments can be modified by having the write bit lines cross over, instead of the read bit lines, with suitable modification of the inputs to the inverting means. The neutralization of coupling noise is the same, regardless of whether the read bit lines or write bit lines cross over.

The inverting means in the first four embodiments can also be a modification of the connections of the memory cells to the bit lines. In the fourth embodiment, for example, instead of using logic gates 41 and 42 to invert the data written in memory cells $MC_1$ to $MC_{N/2}$, it is possible to achieve the same effect by coupling transistor 13 in FIG. 2 to the second write bit line $\overline{\text{WBL}}$, and transistor 11 to the first write bit line WBL.

Various combinations of the sixth to tenth embodiments can be used to reduce coupling noise to a level lower than possible with one of these embodiments alone.

Those skilled in the art will recognize that many other variations are possible within the scope claimed below.

What is claimed is:

1. A semiconductor memory device, comprising:
   a semiconductor substrate;
   a plurality of memory cells formed in said semiconductor substrate;
   a first complementary pair of bit lines coupled to said memory cells, formed in a first interconnecting layer parallel to said semiconductor substrate, and mutually separated by a first distance; and
   a second complementary pair of bit lines coupled to said memory cells, formed in a second interconnecting layer parallel to said first interconnecting layer, and mutually separated by a second distance differing from said first distance.

2. The semiconductor memory device of claim 1, wherein said first complementary pair of bit lines is used for reading data from said memory cells and said second complementary pair of bit lines is used for writing data in said memory cells.

3. The semiconductor memory device of claim 1, wherein said first complementary pair of bit lines is used for writing data in said memory cells and said second complementary pair of bit lines is used for reading data from said memory cells.

4. The semiconductor memory device of claim 1, wherein said first complementary pair of bit lines and said second complementary pair of bit lines have slanted sides.

5. The semiconductor memory device of claim 1, wherein said first complementary pair of bit lines and said second complementary pair of bit lines have a vertical thickness and a horizontal width, and said vertical thickness is less than said horizontal width.

6. The semiconductor memory device of claim 1, further comprising:
   a third interconnecting layer disposed between said first interconnecting layer and said second interconnecting layer; and
   a conductive pattern disposed in said third interconnecting layer between said first complementary pair of bit lines and said second complementary pair of bit lines, for interrupting lines of electrical force between said first complementary pair of bit lines and said second complementary pair of bit lines, thereby reducing capacitive coupling between said first complementary pair of bit lines and said second complementary pair of bit lines.

7. The semiconductor device of claim 6, wherein other interconnecting lines are also formed in said third interconnecting layer, and said conductive pattern is thinner than said other interconnecting lines.

8. The semiconductor device of claim 6, wherein said conductive layer is held at a fixed potential.

9. A semiconductor memory device comprising:
   a semiconductor substrate disposed in a first plane;
   a plurality of memory cells formed in said semiconductor substrate;
   a first complementary pair of bit lines coupled to said memory cells, and formed substantially parallel to each other in a first interconnecting layer disposed in a second plane substantially parallel to said first plane; and
   a second complementary pair of bit lines coupled to said memory cells, and formed substantially parallel to each other in a second interconnecting layer disposed in a third plane substantially parallel to said first plane, said second plane being between said first and third planes;
   wherein for a projection of said first and second complementary pairs of bit lines onto said first plane, one pair of said first and second complementary pairs of bit lines is between the other pair.

10. The semiconductor memory device of claim 9, wherein said first complementary pair of bit lines is used for reading data from said memory cells and said second complementary pair of bit lines is used for writing data in said memory cells.

11. The semiconductor memory device of claim 9, wherein said first complementary pair of bit lines is used for writing data in said memory cells and said second complementary pair of bit lines is used for reading data from said memory cells.

12. The semiconductor memory device of claim 9, wherein said first complementary pair of bit lines and said second complementary pair of bit lines have slanted sides.

13. The semiconductor memory device of claim 9, wherein said first complementary pair of bit lines and said second complementary pair of bit lines have a vertical thickness and a horizontal width, and said vertical thickness is less than said horizontal width.

14. The semiconductor memory device of claim 9, wherein said first complementary pair of bit lines are separated from each other by a spacing smaller than a separation between said second complementary pair of bit lines.

15. The semiconductor memory device of claim 9, further comprising:
   a third interconnecting layer disposed between said first interconnecting layer and said second interconnecting layer; and
   a conductive pattern disposed in said third interconnecting layer between said first complementary pair of bit lines and said second complementary pair of bit lines, for interrupting lines of electrical force between said first complementary pair of bit lines and said second complementary pair of bit lines, thereby reducing capacitive coupling between said first complementary pair of bit lines and said second complementary pair of bit lines.

16. The semiconductor memory device of claim 14, wherein other interconnecting lines are also formed in said third interconnecting layer, and said conductive pattern is thinner than said other interconnecting lines.

17. The semiconductor memory device of claim 14, wherein said conductive layer is held at a fixed potential.

* * * * *